US008301971B2

(12) United States Patent
Liu

(10) Patent No.: US 8,301,971 B2
(45) Date of Patent: Oct. 30, 2012

(54) DIGITAL BROADCASTING SYSTEM AND ERROR CORRECTION METHOD THEREOF

(76) Inventor: Yang Liu, Mountain House, CA (US)

( * ) Notice: Subject to any disclaimer, the term of this patent is extended or adjusted under 35 U.S.C. 154(b) by 851 days.

(21) Appl. No.: 12/434,643

(22) Filed: May 2, 2009

(65) Prior Publication Data

US 2010/0281338 A1 Nov. 4, 2010

(51) Int. Cl.
*H03M 13/00* (2006.01)
(52) U.S. Cl. ........ 714/758; 714/746; 714/751; 714/752; 714/764; 714/799; 714/800; 725/62; 725/63; 725/68; 725/151; 725/144
(58) Field of Classification Search ........................ None
See application file for complete search history.

(56) References Cited

U.S. PATENT DOCUMENTS

| 5,784,683 | A  | * | 7/1998 | Sistanizadeh et al. | 725/73 |
| 7,697,068 | B2 | * | 4/2010 | Aratani et al. | 348/553 |
| 2002/0089610 | A1 | * | 7/2002 | Ohno et al. | 348/734 |
| 2006/0212902 | A1 | * | 9/2006 | Seo et al. | 725/39 |
| 2008/0022317 | A1 | * | 1/2008 | James et al. | 725/68 |
| 2011/0271305 | A1 | * | 11/2011 | Hanabusa | 725/62 |

* cited by examiner

*Primary Examiner* — John Trimmings
(74) *Attorney, Agent, or Firm* — Fenwick & West LLP

(57) ABSTRACT

A digital broadcasting system comprising of a digital broadcasting station, a set of digital broadcast receivers, and a switched network, wherein the digital broadcasting station transmits a digital signal to the set of digital broadcast receivers, and the digital broadcast receivers exchange error correction information with each other using the network to compensate errors in local receptions of the digital signal at each digital broadcast receiver location.

26 Claims, 9 Drawing Sheets

| n | $p_n$ | $R = 0$ | $R = 1$ | $R = 2$ | $R = 3$ | $R = 4$ | $R = 5$ |
|---|---|---|---|---|---|---|---|
| 1 | 14.999999% | 0.000001% | 0.000005% | 0.000028% | 0.000106% | 0.000322% | 0.000834% |
| 2 | 27.750000% | 0.000271% | 0.002227% | 0.010002% | 0.032470% | 0.085228% | 0.191957% |
| 3 | 38.587502% | 0.007319% | 0.052269% | 0.204093% | 0.577051% | 1.321440% | 2.601452% |
| 4 | 47.799376% | 0.062262% | 0.387273% | 1.320300% | 3.268762% | 6.574216% | 11.405325% |
| 5 | 55.629468% | 0.283824% | 1.543166% | 4.616439% | 10.070948% | 17.936581% | 27.708647% |
| 6 | 62.285048% | 0.878695% | 4.192688% | 11.066077% | 21.437518% | 34.149066% | 47.572093% |
| 7 | 67.942291% | 2.090051% | 8.815512% | 20.663087% | 35.855835% | 51.683766% | 65.891618% |
| 8 | 72.750950% | 4.153236% | 15.470400% | 32.431433% | 50.918305% | 67.280189% | 79.781473% |
| 9 | 76.838309% | 7.174271% | 23.791097% | 44.930164% | 64.570689% | 79.333371% | 88.907373% |
| 10 | 80.312562% | 11.164381% | 33.144191% | 56.944132% | 75.686526% | 87.678701% | 94.283362% |
| 11 | 83.265674% | 16.019911% | 42.828149% | 67.502129% | 84.018219% | 93.000758% | 97.209620% |
| 12 | 85.775822% | 21.500012% | 52.227354% | 76.219320% | 89.869064% | 96.180457% | 98.693782% |
| 13 | 87.909448% | 27.564853% | 60.892272% | 83.054348% | 93.772411% | 97.983998% | 99.409771% |
| 14 | 89.723033% | 33.809555% | 68.555522% | 88.195097% | 96.268511% | 98.965037% | 99.740982% |
| 15 | 91.264576% | 40.088749% | 75.107962% | 91.932881% | 97.811794% | 99.480820% | 99.889632% |
| 16 | 92.574894% | 46.230873% | 80.557799% | 94.576263% | 98.739809% | 99.745140% | 99.953425% |
| 17 | 93.688655% | 52.103895% | 84.988445% | 96.403450% | 99.285215% | 99.876320% | 99.980778% |
| 18 | 94.635361% | 57.614839% | 88.523132% | 97.642785% | 99.597311% | 99.940026% | 99.992174% |
| 19 | 95.440054% | 62.705672% | 91.299111% | 98.470259% | 99.778250% | 99.971105% | 99.996853% |
| 20 | 96.124047% | 67.347342% | 93.450856% | 99.015340% | 99.873275% | 99.986953% | 99.998748% |

DIGITAL BROADCASTING SYSTEM AND ERROR CORRECTION METHOD THEREOF

BACKGROUND OF THE INVENTION

1. Field of the Invention

This invention relates generally to digital broadcasting. More particularly, it relates to a digital broadcast receiver which is used for a digital broadcasting system in which on the transmission side a broadcast station codes a digital signal to modulate an analog carrier signal for broadcast by radio or by cable, and which on the reception side, a digital broadcast receiver digitally demodulates the received analog signal into a digital signal, detects and corrects errors, and decodes the resulting output back into the original digital signal.

2. Description of the Related Art

Digital signals are typically encoded into a variety of data compression formats to reduce their transmission bit-rate to fit within bandwidth limitations/allocations. Each coded digital signal is assigned a distinct channel that modulates the respective band of an analog carrier signal for broadcast by radio or cable. Terrestrial and satellite radio transmissions, however, are very susceptible to signal distortions caused by local physical effects such as attenuation, cross-talk, and dynamic multipath interference. Cable transmissions may also experience similar problems with signal interference; especially cross-talk induced by magnetic fields from unshielded conductors. These distortions cause digital broadcast receivers to demodulate bits incorrectly from the received analog signal. If uncorrected, single bit errors become significantly magnified when the digital signal is decoded and decompressed. Unfortunately, in a digital broadcast, the data is communicated only in one direction (from broadcast station to receivers) and receivers cannot request retransmissions of the original data when they encounter errors.

Digital broadcasting standards address this problem by specifying forward error correction schemes, which essentially provides redundant coding of the data into parity data to improve the error resiliency of the transmission. The parity data allow receivers to detect and repair errors, and reconstruct the original digital signal. Unfortunately, forward error correction fail sometimes and receivers with more errors than parity data cannot correct any of the errors.

To compartmentalize failures and preserve quality-of-service, the standards also specify digital streaming formats to arrange and transmit the signal data as a sequence of blocks where each block contains its own section of parity data; a burst of errors will limit data erasures to only a few individual blocks, while preserving the remaining parts of the received digital signal. However, a large sustained bit-error rate may preclude many blocks from being decoded and completely interrupt the digital signal reception. In this situation, despite receiving and demodulating some bits correctly, there is not enough information to decode the (compressed) digital signal and the received bits are essentially discarded. Thus, the coverage area of a digital broadcast is effectively limited by the average bit-error rate encountered at local receivers.

Existing approaches to expand this coverage area include increasing the broadcast transmission power to improve the signal gain (e.g. SNR) at local receivers, adding more parity data or coding redundancy to improve error tolerance, or building repeater transmission towers to provide fringe coverage. Unfortunately, these approaches are very costly to implement and do not scale well. Since the broadcasting is dispersed across a hemisphere, the received signal power is inversely proportional to the squared distance from the transmission source; maintaining the same signal quality while doubling the distance requires quadrupling the original transmission power. Broadcasting with more parity data enables reception at lower SNRs and can extend the broadcast range, but the extra parity data reduces the effective bandwidth of the transmission channel. Finally, building repeater transmission towers involves significant cost, planning, and maintenance, and their proliferation may lead to further signal interference.

Thus, there is a need for a more cost-effective method to improve the quality-of-service and coverage area of a digital broadcast transmission.

SUMMARY OF THE INVENTION

The present invention overcomes the limitations of the prior art by specifying a digital broadcast receiver that compensates for independent bit errors encountered during a digital broadcast transmission through data exchange with other such digital broadcast receivers.

It is an object of the present invention to provide a digital broadcast receiver that creates, transmits, receives, and decodes digital messages routed across a switched network, to compensate for independent bit errors in local receptions of a digital broadcast.

It is another object of the present invention to provide a digital broadcast receiver that discovers the existence of, manages online contact with, and negotiates data exchange with other digital broadcast receivers on a switched network.

It is a further object of the present invention to provide a digital broadcast receiver that decodes and buffers two or more simultaneous channels from a digital broadcast to increase error correction opportunities for other digital broadcast receivers, and to minimize the channel selection latency for switching between the decoded outputs of two or more digital signal channels.

The first embodiment according to the present invention is a digital broadcast receiver which can be used in the digital broadcast system that codes the digital data and adds additional data for control, information transmission, and error correction, and then transmits the digital signal, using radio or cable, to one or more digital broadcast receivers. In one embodiment, a digital broadcast receiver demodulating digitally broadcasted signals received by a receiving circuit comprises: a demodulating means for demodulating an analog signal into a digital signal; a detecting means for detecting transmission errors in a received digital broadcasting signal; a buffering means for buffering a received digital broadcasting signal; a communicating means for transmitting and receiving data packets in a switched network; and a correcting means for correcting errors in a received digital broadcasting signal.

The second embodiment of the present invention is characterized in that the demodulating means of the digital broadcast receiver of the above-mentioned first embodiment demodulates two or more digital channels from the received analog signal.

In the first and second embodiments of the present invention, the demodulating means demodulates a received analog signal into a digital signal (which may include one or more digital channels) and then the detecting means detects bit errors in the digital signal. The correcting means corrects errors using the parity data (if available) of the digital signal and then the buffering means buffers the corrected digital signal into a temporary buffer. If the errors cannot be corrected locally using the received parity data, then the communicating means retrieves additional data from the network to compensate the errors. The correcting means then uses the additional data to correct errors in the buffered signal before the signal is output for further processing by the digital broadcast receiver.

In other words, the digital signal is broadcasted from a broadcasting station and received by a set of physically separated digital broadcast receivers. Since the reception errors are due to localized physical effects that distort the transmitted analog signal, the errors encountered during demodulation by each digital broadcast receiver are likely to be independent. By sharing portions of the received digital signal with the network, each digital broadcast receiver benefits from the larger spatial diversity and the collective error correction potential will increase. Each digital broadcast receiver may choose a different channel for output from the received analog signal, so multiple simultaneous digital channels should be buffered and decoded to increase the diversity of information and availability of error correction opportunities in the network; two digital broadcast receivers could output different channels from the same digital broadcasting signal, but still provide error correction for each other if they both demodulate and decode the same two channels. Furthermore, buffering multiple channels provides local advantages for each digital broadcast receiver in that the switching latency for choosing a different output channel from the digital broadcast signal may be significantly reduced since the switching occurs at the outputting stage and not the demodulating stage. To leverage the spatial diversity of the network, a method is required to share data among digital broadcast receivers.

One method for coordinating data sharing in the network is collecting the digital broadcast data at a single location. For example, each digital broadcast receiver in the network transmits its locally received portions of the digital broadcast data to a known repository, such as a network router or similar device. Once the digital signal is assembled at a repository, each digital broadcast receiver can request data from the repository for decoding the digital signal. Where a repository is used, synchronization is used to signal each digital broadcast receiver when their missing pieces of data becomes available at the repository. Alternatively, instead of contributing data to a central repository, each digital broadcast receiver may broadcast its data directly to the entire network.

Alternatively, a peer-to-peer communication model where each digital broadcast receiver directly connects with another digital broadcast receiver to exchange data for error correction may be used. The peer-to-peer communication model allows a larger number of digital broadcast receivers to exchange data without using a centralized storage location. The peer-to-peer communication model also shares data more efficiently between digital broadcast receivers by independently managing communication relationships. Additionally, communication costs in the peer-to-peer communication model scale linearly with the network size. To effectively exchange data, each digital broadcast receiver identifies additional digital broadcast receivers in the network and includes data specifying desirable communication relationships between digital broadcast receivers for error correction.

The following describes the embodiments of the present invention for discovering contacts, establishing network connections, and exchanging error correction information between digital broadcast receivers in the switched network.

The third embodiment according to the present invention comprises the above-mentioned means of the digital broadcast receiver in the first or second embodiment and is further characterized by: a calculating means for calculating an error frequency; a recording means for recording the location of errors in a received digital broadcasting signal; a discovering means for discovering new digital broadcast receiver contacts; and a judging means for judging the quality of a contact or connection.

In the third embodiment of the present invention, the calculating means calculates an error rate from the detected errors and the recording means records the location of these errors. The initializing process produces a list of digital broadcast receiver contacts on the network, and the communicating means described in the first or second embodiment transmits a connection request packet, which comprises the output channel number, the error rate, and error location information of the digital broadcast receiver, to potential contacts. When the communicating means of the digital broadcast receiver receives a connection request from a digital broadcast receiver, the judging means judges the error correction potential of the requesting digital broadcast receiver and decides whether the connection request should be accepted or rejected. Likewise, the judging means periodically examines existing connections to measure their error correction benefits relative to bandwidth costs, and decide which connections should be maintained. Per the initializing process, the communicating means may also request contacts from each digital broadcast receiver it is already connected with. When the communicating means of a digital broadcast receiver receives such a request, it replies by suggesting possible contacts from its own list of contacts or existing connections to the requesting digital broadcast receiver. Each contact may optionally be introduced with its error rate and error location information.

In other words, the digital broadcast receivers connect and exchange information with each other for error correction. Each digital broadcast receiver determines its own error correction needs to identify desirable relationships in the network. Towards this end, each digital broadcast receiver maintains a set of error state statistics, comprising an error rate (e.g. number of bit errors per digital data block or number of block errors per frame) and an error distribution (coded as a bit vector) from recent data receptions, to determine how much and where error correction needs to be applied.

To coordinate network connections and help digital broadcast receivers discover each other, special "trackers" are configured to each maintain a list of active digital broadcast receivers on the network, accept connection requests from digital broadcast receivers, and fulfill requests for contacts. Each digital broadcast receiver will, upon initialization, connect with a tracker and request a list of contacts. When this request is received by the tracker, the tracker registers the requesting digital broadcast receiver and suggests for it a list of contacts. The digital broadcast receiver, having received this list, will then attempt connection with each contact. The contacted digital broadcast receiver will compare the error state of the contacting digital broadcast receiver with its own error state and decide if the relationship will be beneficial. Factors guiding this decision include the network communication bandwidth and latency, respective error rates, and the error locations. These factors are periodically reviewed for each connection to judge whether the connection should be maintained. For example, a digital broadcast receiver may wish to connect with another digital broadcast receiver physically located far away so that they won't encounter the same errors. One way to approximately satisfy this condition is to measure the correlation of error locations. If the locations of errors for each digital broadcast receiver are stored in a vector, then the dot-product between the two vectors is a useful metric for measuring error correlation. Each digital broadcast receiver may also periodically request contacts from its existing connections to discover other digital broadcast receivers.

If the digital broadcast receiver has no active connections or contacts, then the digital broadcast receiver will again request more contacts from a tracker.

The fourth embodiment according to the present invention comprises the above-mentioned means of the digital broadcast receiver in any of the first through third embodiments and is further characterized by: a synchronizing means for synchronizing data between two digital broadcast receivers.

In the fourth embodiment of the present invention, the synchronizing means synchronizes data between pairs of digital broadcast receivers in the network. One way to synchronize data between two digital broadcast receivers would be to have each request its missing pieces of data from the other and then fulfill such requests when possible. Since a digital broadcast receiver may maintain multiple connections, it could request missing pieces of data from multiple other digital broadcast receivers, resulting in redundant copies of the data and larger communication overhead. Furthermore, this method requires a round-trip of communication to synchronize each piece of data (i.e. data pieces must be explicitly requested before they are transferred), which could lead to lower communication throughput and higher latencies. To remove the need for data requests, another method directly streams data from one digital broadcast receiver to another. However, streaming the entire set of received data blocks may be inefficient, and communication faults may cause the reception loss of some data blocks from the stream. To obtain data for error correction, parity codes derived from the data from one digital broadcast receiver are streamed to other digital broadcast receivers. On the transmission side, the digital broadcast receiver does not need to know which pieces of data the receiving digital broadcast receiver needs. On the receiving side, the digital broadcast receiver collects parity codes from multiple sending digital broadcast receivers until enough information is available to decode the missing data blocks.

The fifth embodiment according to the present invention comprises the above-mentioned means of the digital broadcast receiver in the fourth embodiments and is further characterized by: a first calculating means for creating parity codes from the received digital broadcasted signal; a second calculating means for decoding data using parity codes; and a data streaming means for exchanging data between digital broadcast receivers.

In the fifth embodiment of the present invention, when a connection is established using the communicating means between two digital broadcast receivers, the first calculating means will calculate a set of parity codes, which the communicating means of each digital broadcast receiver directly transmits to another digital broadcast receiver. When the set of parity codes are received, the second calculating means will use these parity codes, along with the received digital signal in the buffer, to calculate the original digital signal. The results will be assembled together in the buffer.

In other words, each digital broadcast receiver computes and streams a set of parity codes to other digital broadcast receivers. The advantages of this approach are twofold: a set of parity codes can be forwarded to the digital broadcast receiver before the errors are even detected, and the computed parity codes can be reused to benefit other contacts with which the digital broadcast receiver is connected.

Thus, the digital broadcast receiver computes parity codes from the demodulated digital signal, stores them temporarily, and then streams the codes to digital broadcast receivers that it is connected with. Several parity coding methods are possible, including (but not limited to) Hamming error correction coding, Viterbi coding, Reed-Solomon coding, turbo coding, and low-density parity check coding. Many of these coding methods are already specified in digital broadcasting standards.

The sixth embodiment according to the present invention comprises the above-mentioned means of the digital broadcast receiver in the fifth embodiment and is further characterized in that the first and second calculating means for calculating and decoding parity bits are based on the Reed-Solomon coding method.

In the sixth embodiment of the present invention, the Reed-Solomon coding is used to derive an arbitrary amount of parity codes from the received digital broadcast data. New parity codes can even be derived from existing parity codes. In this embodiment, Reed-Solomon codes are computed from potentially incomplete data receptions and the number of codes computed is proportional to the recipients' average bit-error rate. Network coding methods can also be implemented using Reed-Solomon to improve the availability of data in the network. Reed-Solomon coding is also highly efficient to implement in hardware, as it requires only integer arithmetic and memory referencing operations.

The seventh embodiment according to the present invention comprises the above-mentioned means of the digital broadcast receiver in any of the first through sixth embodiments and is further characterized by: an indicating means for indicating the output channel, signal quality of the digital broadcast signal, and the network status; and an inputting means for inputting control parameters of the digital broadcast receiver.

In the seventh embodiment of the present invention, the indicating means indicates the output channel, signal quality of the digital broadcast signal, and the network status on a front panel visual display. The status of the network (e.g. total number of connections, upload and download rates, and error correction rate) may be indicated visually in abstract. For example, the network status can be displayed graphically as a set of vertexes and edges where each digital broadcast receiver is represented by a vertex, and an edge incident across a pair of vertexes represents the link between two digital broadcast receivers. The weight or color of the edge could, for example, indicate the error correction rate or ratio of download to upload. The inputting means allows input control parameters to be specified for the digital broadcast receiver, such as the network upload and download limits, channel selection, and signal buffering lengths. The inputting means could be implemented as a set of front buttons, or a touch-screen interface device coupled to the indicating means.

The eighth embodiment according to the present invention comprises the above-mentioned means of the digital broadcast receiver in the seventh embodiment and is further characterized in that the indicating and inputting means are jointly implemented using a web-based interface, such as a web page.

In the eighth embodiment of the present invention, the indicating and inputting means are implemented using a web control interface, such as a web page. The digital broadcast receiver uses the communicating means to host a secure HTTPS web page to display the signal quality and network status, and also to allow configuration of the control parameters from any permissible web terminal connected to the switched network.

The ninth embodiment according to the present invention comprises the above-mentioned means of the digital broadcast receiver in any of the first through eighth embodiments and is further characterized in that the digital broadcasting system broadcasts digital video and audio signals to a set of digital broadcast receivers, capable of decoding the digital video and audio signal into appropriate output formats for display.

In the ninth embodiment of the present invention, the digital broadcast receivers are configured as consumer electronic devices to receive and correct reception errors in digital television broadcasts. Such a digital broadcast receiver could be designed as an internal component of a digital television, or as an external set-top box that delivers a digital video signal to a digital television.

The tenth embodiment according to the present invention comprises the above-mentioned means of the digital broadcast receiver in any of the first through ninth embodiments and is further characterized in that the digital broadcasting receivers intercept digital broadcast signals in a digital broadcasting system for a private communication network.

In the tenth embodiment of the present invention, the digital broadcast receivers are configured to intercept digital messages from a private radio/satellite communication link. In most cases, the messages are encrypted and cannot be decrypted if some pieces of the messages were received with error. Since the digital broadcast receivers are not participants in the communication network, they cannot request retransmission of the missing pieces. Thus, deploying an array of digital broadcast receivers to eavesdrop in the communication network will significantly improve the chances of recovering complete messages.

Other aspects of the invention include methods corresponding to the devices and systems described above.

BRIEF DESCRIPTION OF THE DRAWINGS

The invention has other advantages and features which will be more readily apparent from the following detailed description of the invention and the appended claims, when taken in conjunction with the accompanying drawings, in which:

FIG. 4 is a table of transmission probabilities for a digital broadcasting example.

DETAILED DESCRIPTION OF THE PREFERRED EMBODIMENTS

The preferred embodiments of the present invention will be described below with reference to the appended drawings.

Figure 1:
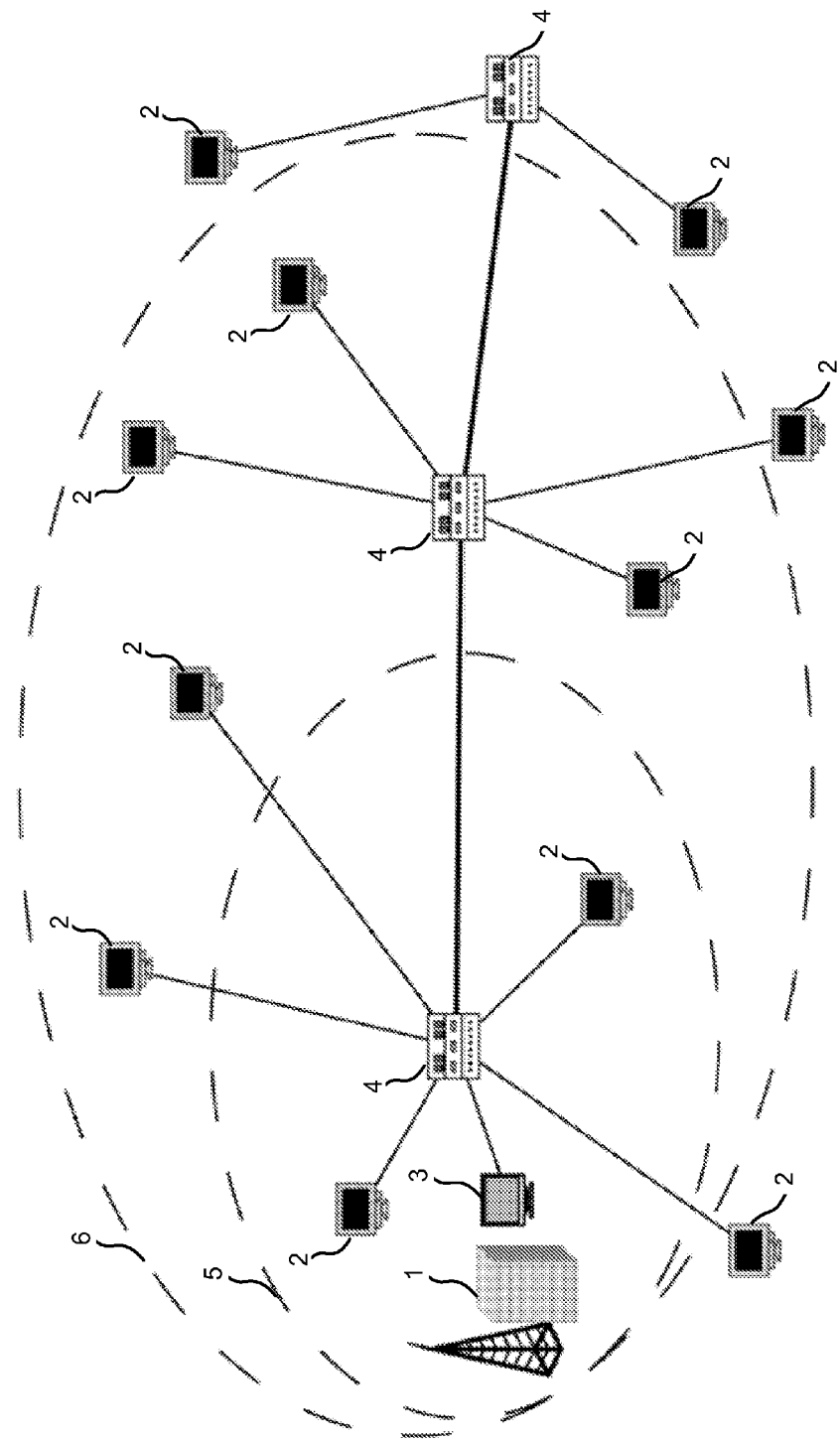
FIG. 1 is a block diagram of a digital broadcasting system of the present invention.

FIG. 1 shows the concept of the digital broadcasting system as a block diagram. This digital broadcasting system comprise a digital broadcasting station 1, a set of digital broadcasting receivers 2, a special "tracker" 3, and a set of switched network routers 4.

A program produced by the digital broadcasting station consists of video and audio signals, which are coded into a digital signal and then compressed by a data compression technique. The compressed digital signal modulates a frequency band of an analog carrier signal, which is then broadcasted over-the-air by radio transmission. The analog signal is received by a digital broadcast receiver, which demodulates the analog signal into a compressed digital signal format and decodes from it the original video and audio signals. However, the analog signal may be distorted by noise, causing the digital signal to be received with bit errors by the digital broadcast receiver.

FIG. 1 depicts an example where digital broadcast receivers in region 5 receive the digital signal without errors, while digital broadcast receivers in region 6 receive the digital signal with intermittent error. In the example of FIG. 1, digital broadcast receivers outside of region 6 cannot receive the digital signal. The errors encountered at each digital broadcast receiver location are likely independent, so each digital broadcast receiver can share data from its local reception of the digital signal with other digital broadcast receivers to compensate for reception errors. The data sharing is coordinated by a special tracker that remains active and known to all other digital broadcast receivers. Communication messages between the digital broadcast receivers are forwarded by a connected set of switched network routers.

Figure 2:
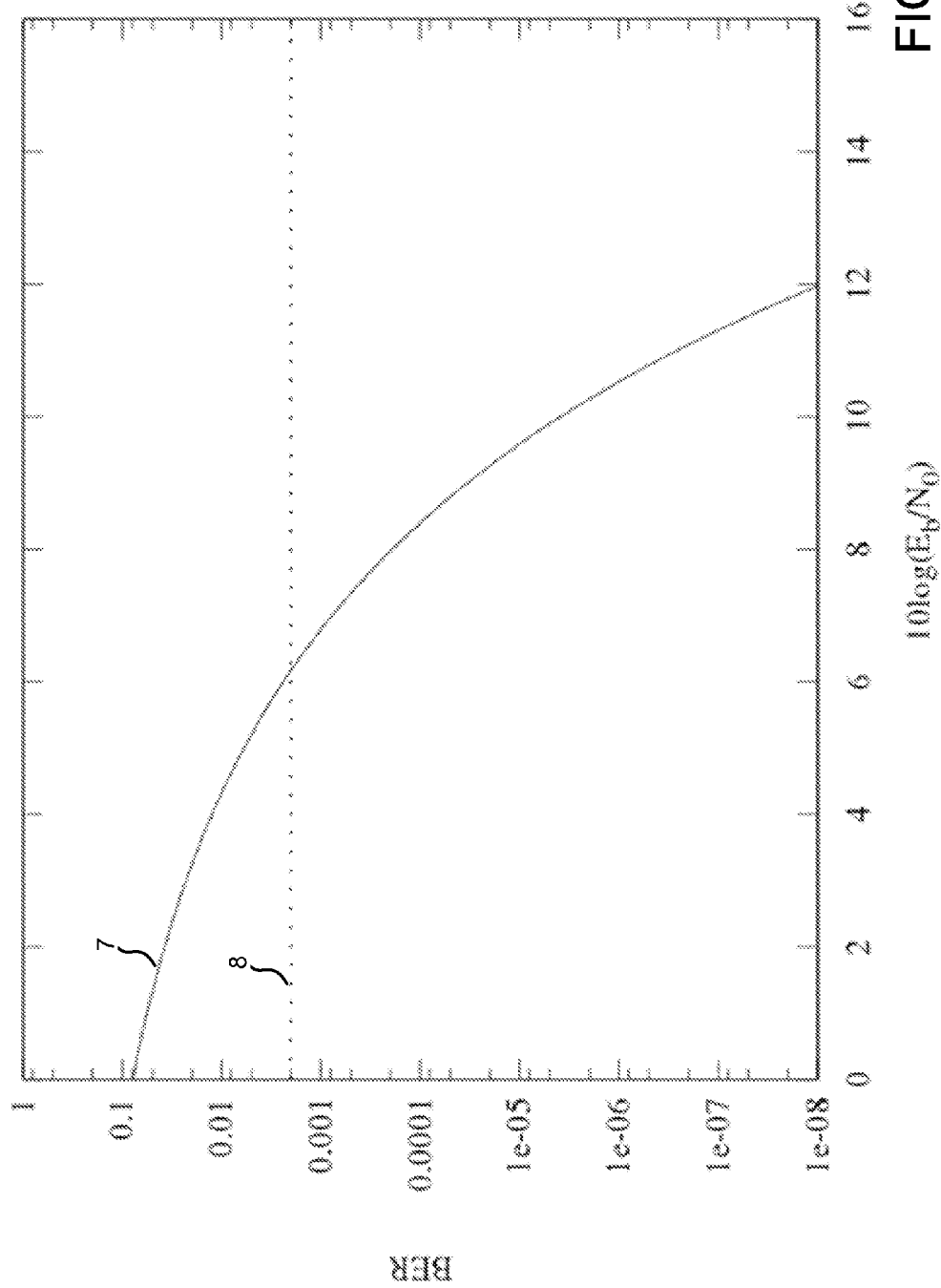
FIG. 2 is a graph plot of the bit-error rate as a function of the bit energy to noise density ratio.

The rate of bit errors encountered by each digital broadcast receiver location depends on its distance from the transmission source, the local noise profile, and the modulation format. FIG. 2 plots the bit-error rate (BER) performance of modulation by Quantum Phase-Shift Keying (QPSK) as a function of the bit energy $E_b$ to noise density $N_0$ ratio. Here, the QPSK BER is given by:

$$P_{bit\ error} = erfc\left(\sqrt{\frac{2E_b}{N_0}}\right) \quad (1)$$

Curve 7 predicts that the BER will increase as $E_b/N_0$ decreases. Since compressed digital signals are very sensitive to bit errors, digital broadcasting standards specify forward error correction schemes to provide information redundancy through parity coding. The coding redundancy increases the amount of data to transmit, but can correct up to a fixed number of bit-errors. However, if the bit-error rate exceeds the parity coding rate, then none of the bit errors are correctable. This situation is known as the digital cliff effect where a digital broadcast reception can experience a sudden transition from perfect reception to a complete loss of signal.

Curve 8 shows an example cutoff point where digital signal receptions with BERs lower than the threshold are correctable, while receptions with higher BERs cannot be corrected. The effective coverage area for a digital signal broadcast can be enlarged by increasing the transmission power or parity coding rate. Since the transmission power radiates from the broadcasting source across a hemisphere, the received energy is inversely proportional to the square of the distance from the source; doubling the distance while maintaining the same energy-per-bit requires quadrupling the transmission power. Increasing the parity coding rate also provides more error resiliency, but reduces the effective channel bandwidth. Hence, both of these approaches do not scale well with respect to distance and coverage area.

Figure 3:
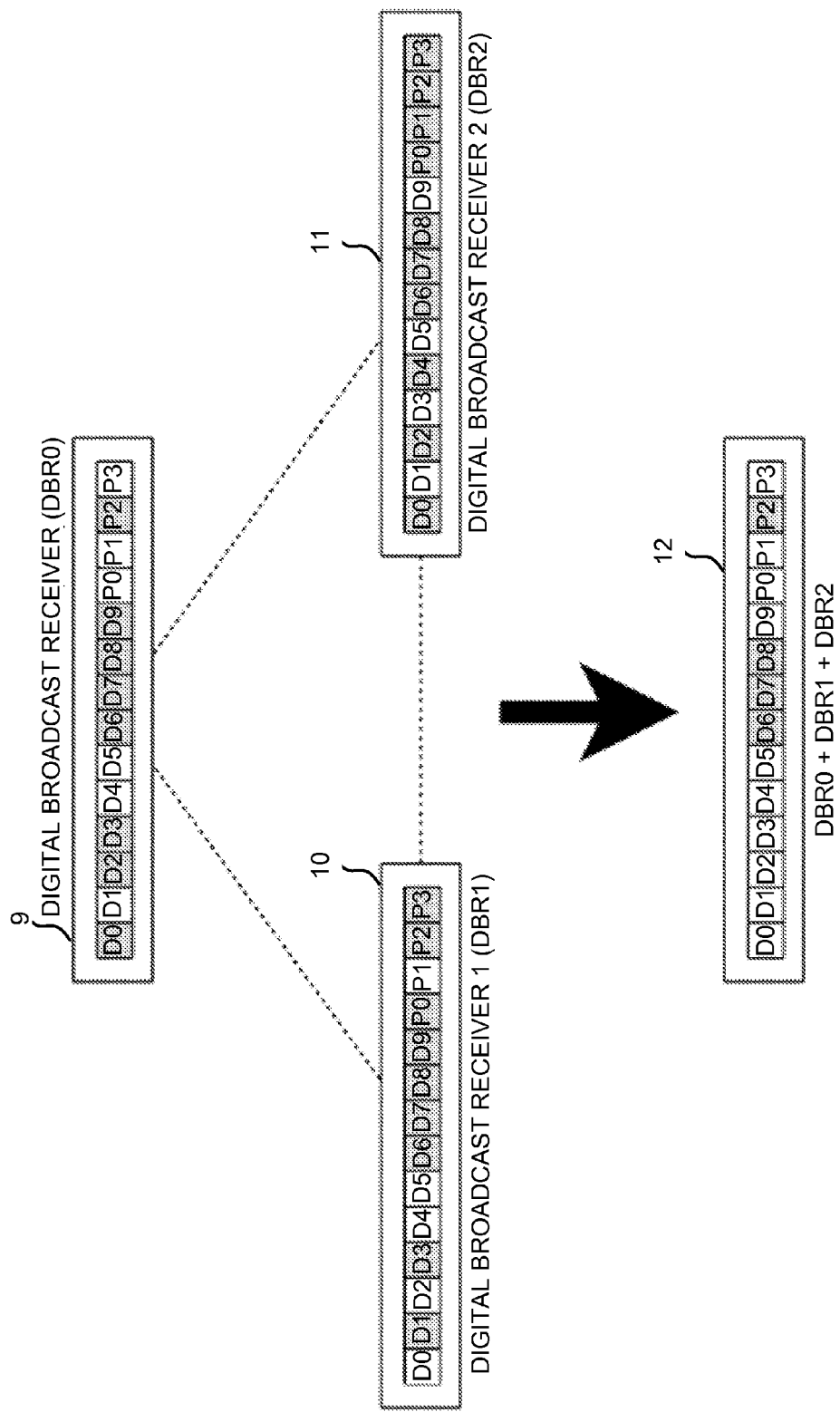
FIG. 3 is a block diagram showing data-sharing for a digital broadcasting example.

Because the bit-errors encountered by each digital broadcast receiver are likely independent due to spatial diversity; a set of physically separated receivers has a greater chance of correctly receiving the signal across the collective than an individual receiver. FIG. 3 illustrates this concept with an example. Therein, the digital broadcasting station transmits 14 blocks, 10 of which are data blocks and 4 of which are parity code blocks. Digital broadcast receiver 9 successfully receives 6 blocks, while digital broadcast receiver 10 receives 5 blocks, and digital broadcast receiver 11 receives 4 blocks. No individual receiver has enough parity coding information to recover its missing data blocks. However, if each digital broadcast receiver shares their received blocks with the other two, then each could have 7 data blocks and 3 parity code blocks (12); a situation where the 3 missing data blocks can be recovered using the parity codes.

FIG. 4 tabulates the probabilities of successfully receiving the digital signal as a function of the number of digital broadcast receivers n and the number of parity blocks R, assuming Q=10 data blocks with the probability $p_1$=0.15 of a single digital broadcast receiver receiving a block. Thus, the probability $p_n$ that the block is received by at least one out of n receivers is given by:

$$p_n = (1-(1-p_1)^n) \quad (2)$$

The probability P of receiving enough data to completely reconstruct the digital signal is characterized in that the digital broadcast receiver must receive at least Q out of Q+R blocks. For n digital broadcast receivers, this probability $P_n$ is given by:

$$P_n = \sum_{k=Q}^{Q+R} \binom{Q+R}{k} p_n^k (1-p_n)^{Q+R-k} \quad (3)$$

As shown in FIG. 4, a single digital broadcast receiver in a digital broadcasting system without parity must receive all 10 data blocks; the probability of this event occurring is negligible 13. Even in a digital broadcasting system with 5 parity blocks, the probability of successful reception is extremely unlikely 14. A group of 10 digital broadcast receivers has a much better chance of receiving each block, but with no parity blocks the probability of receiving the entire digital signal is still low 15. However, if the digital broadcasting system includes 5 parity blocks, the probability of correctly receiving the digital signal among the 10 digital broadcast receivers improves dramatically 16. Finally, with 20 receivers and 5 parity blocks, successful reception of the digital signal is very likely 17. This analysis, however, takes the assumption that the probability of receiving a block correctly is statistically independent; that is, the errors encountered by the digital broadcast receivers are uncorrelated. In practice, any set of receivers will observe error statistics with both correlated and uncorrelated components. The error correlation decreases the collective reception probability, but can be compensated by including more parity blocks. Moreover, adding receivers at new locations improves the spatial diversity and further reduce the error correlation.

Figure 5:
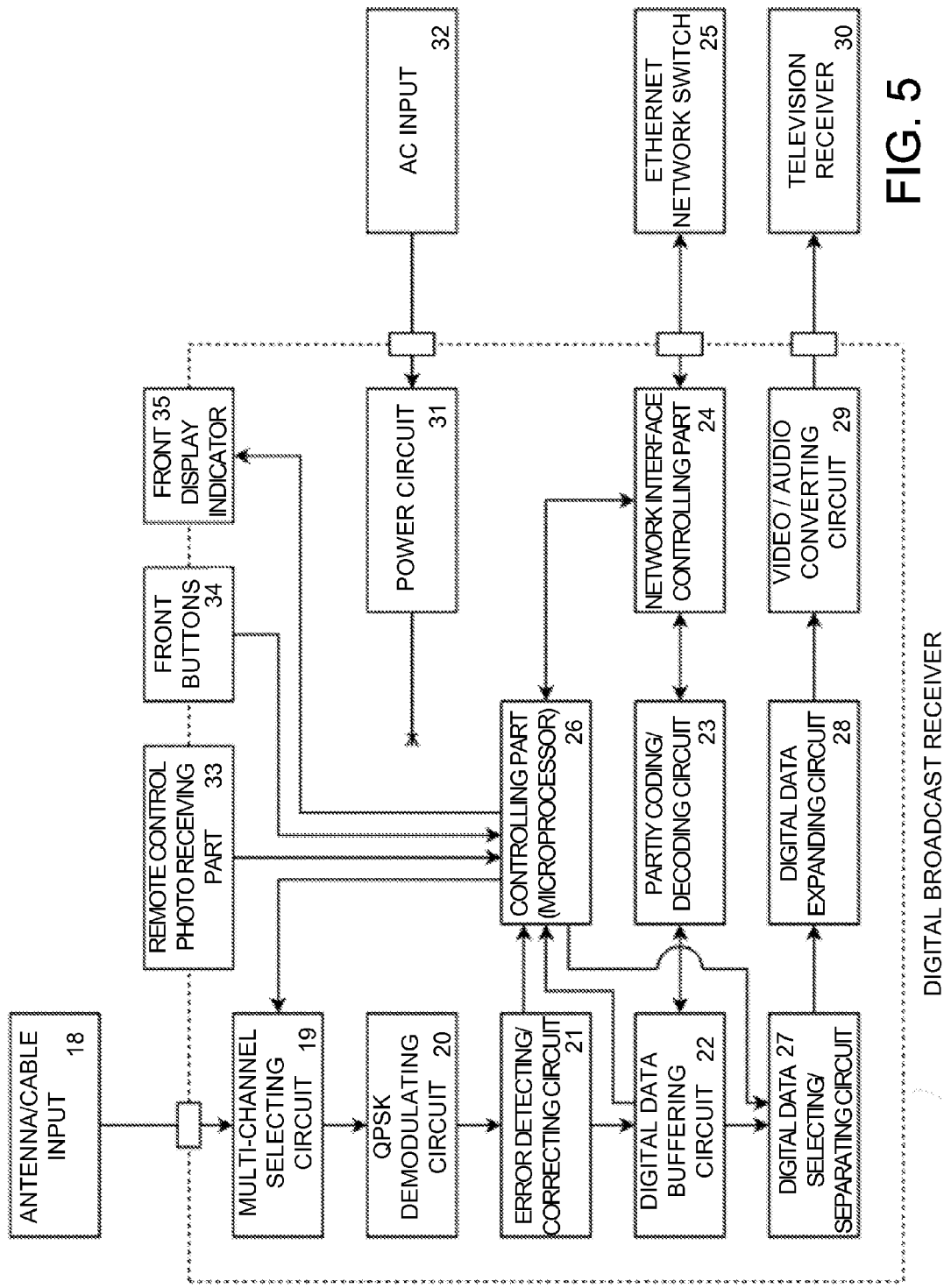
FIG. 5 is a block diagram of a digital broadcast receiver of the present invention.

FIG. 5 shows a block diagram of the digital broadcast receiver of the present invention. An analog signal is input into the receiver by an antenna or cable source 18. The multi-channel selecting circuit 19 filters the respective frequencies of each selected channel. The filtered signal is then passed to the QPSK demodulating circuit 20, which converts the analog signal into a digital signal. Errors in the digital signal are detected and correctable errors are corrected by the error detecting/correcting circuit 21. Error statistics such as the error rate, location of errors, and error correction rate are also collected during processing.

At this point in the processing, the resulting digital signal may still contain errors that could not be corrected from the initial reception. The digital signal is therefore first stored by the digital data buffering circuit 22 into a buffer prior to output or display to await further error correction information from other digital broadcast receivers. The parity coding/decoding circuit 23 creates new parity code blocks from the digital data in the buffer of the digital data buffering circuit, and also corrects errors in the digital data using the parity code blocks received from other digital broadcast receivers. The network interface controller 24 implements the network protocol layer to manage communications with other devices on the switched network 25. The parity codes are transmitted by network broadcast or streaming to multiple recipients.

The controlling part 26 receives and processes input commands from the remote control photo receiving part and the front buttons, produces output for display on the front display indicator, and controls the multi-channel selection circuit and digital data selecting/separating circuit to select channels from the received digital signal for decode and output. Note that while only a single channel is intended for output, multiple channels may be decoded simultaneously to assist in error correction for other digital broadcast receivers. Furthermore, decoding and buffering multiple channels in advance reduces the latency cost of switching the selected output between them. The controlling part also maintains the digital broadcast receiver state manages communication sessions with other digital broadcast receivers, and implements a HTTPS web server for receiving configuration commands over the network. In one configuration, the controlling part 26 also hosts a secure web page which displays signal quality and network status. The secure web page also allows control parameters to be specified at a remote web terminal and transmitted to the digital broadcast receiver via the network. This beneficially allows remote configuration of the digital broadcast receiver.

The digital data selecting/separation circuit 27 selects the output channel from the buffered (and corrected) digital signal, and the digital data expanding circuit 28 decompresses the digital signal into digital video and audio components. Finally, the video/audio converting circuit 29 converts the video and audio components into the appropriate digital or analog format for output display to an external receiver 30.

All circuits and component parts of the digital broadcast receiver are powered by the power circuit 31, which converts an external AC power source 32 into DC power. The external control interface of the digital broadcast receiver comprise a remote control photo receiving part 33, which receives commands communicated by a remote control device across infrared light, a set of front buttons 34 for inputting commands, and a front display indicator 35 for displaying output messages and statistics relevant to the digital broadcast receiver's processing state.

Figure 6:
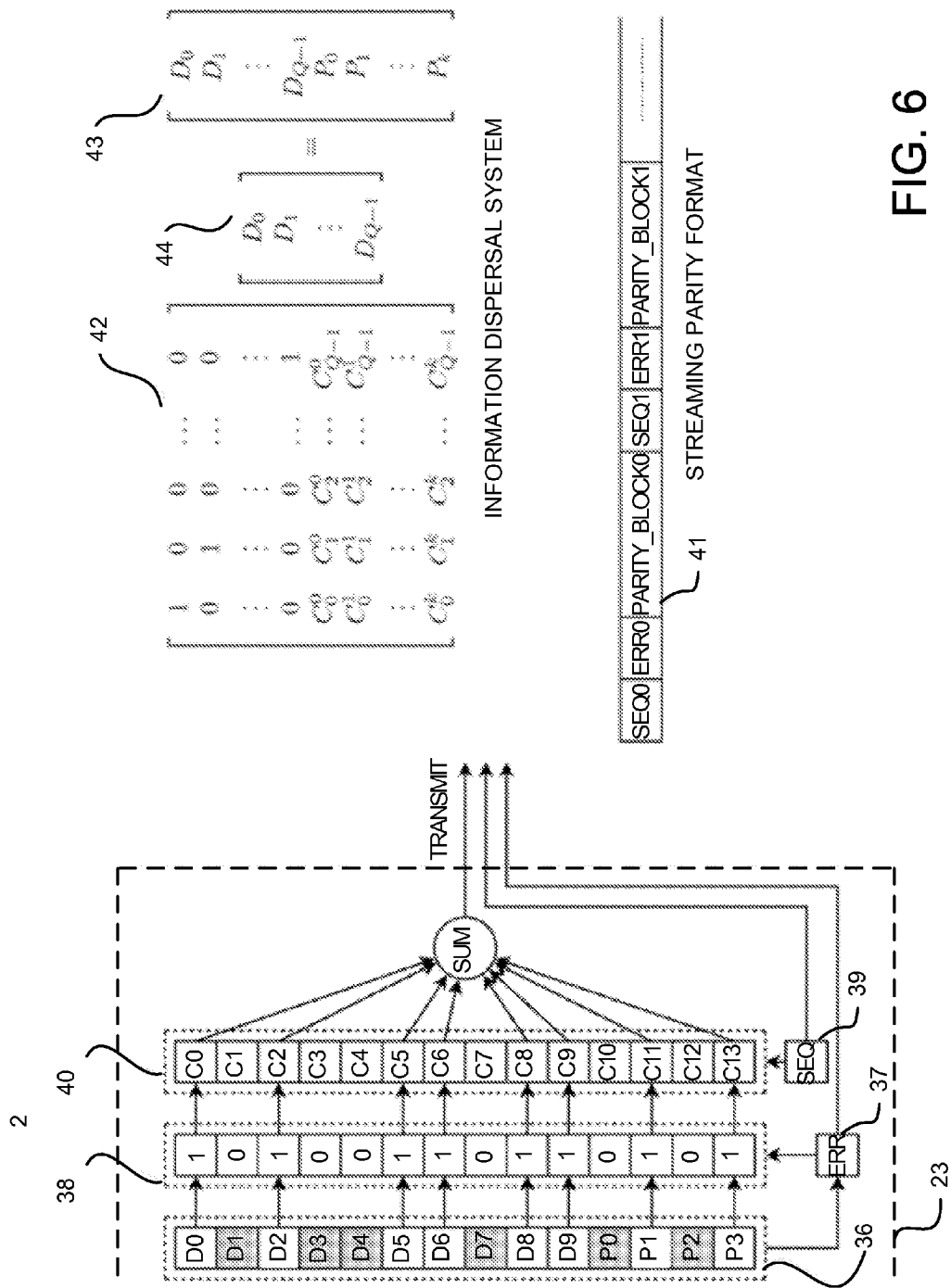
FIG. 6 is a block diagram of the data parity coding/decoding logic and streaming transmission format.

FIG. 6 shows a block diagram of the parity coding circuit and streaming parity format. The received digital signal 36 may contain uncorrected errors. The location of these errors are stored as a bitfield vector 37 and are used to generate an error mask 38 to select the set of blocks from which a e new parity code blocks are computed. The parity blocks are uniquely indexed by a sequence number 39, which is used to generate a unique set of coding coefficients 40 for each block. The parity block for a given sequence number is computed by a linear combination of the data blocks, with weights determined from the error mask and generated coding coefficients.

The arithmetic operations are expressed using the Galois finite number field, where additions and subtractions are implemented as bitwise exclusive-or operations, and multiplication/division operations are implemented as bitwise exclusive-or operations in the logarithmic domain with a lookup table to map arithmetic values between the linear and logarithmic domains.

The streaming parity format 41 contains frames that each contains the sequence number, the error bitfield, and the associated parity block. The sequence number and error bitfield allows a recipient to reconstruct the linear coding coefficients. The coding coefficients are collected into the information dispersal matrix 42, and the respective parity blocks are collected into the vector of received blocks 43. The coding coefficients for the streaming parity format include the original parity blocks in the linear combination. Since the parity codes are already linear combinations of data blocks, the coding coefficients from the original parity codes are factored into the set of coding coefficients generated from the sequence number.

Together, the information dispersal matrix and the vector of received blocks define a linear system with the set of data blocks 44. The decoding parity circuit solves this linear system to recover the set of data blocks using Gaussian Elimination, again using arithmetic operations under the Galois finite number field. If this system cannot be solved, then the decoding parity circuit either waits for more parity blocks or aborts the error correction.

Figure 7:
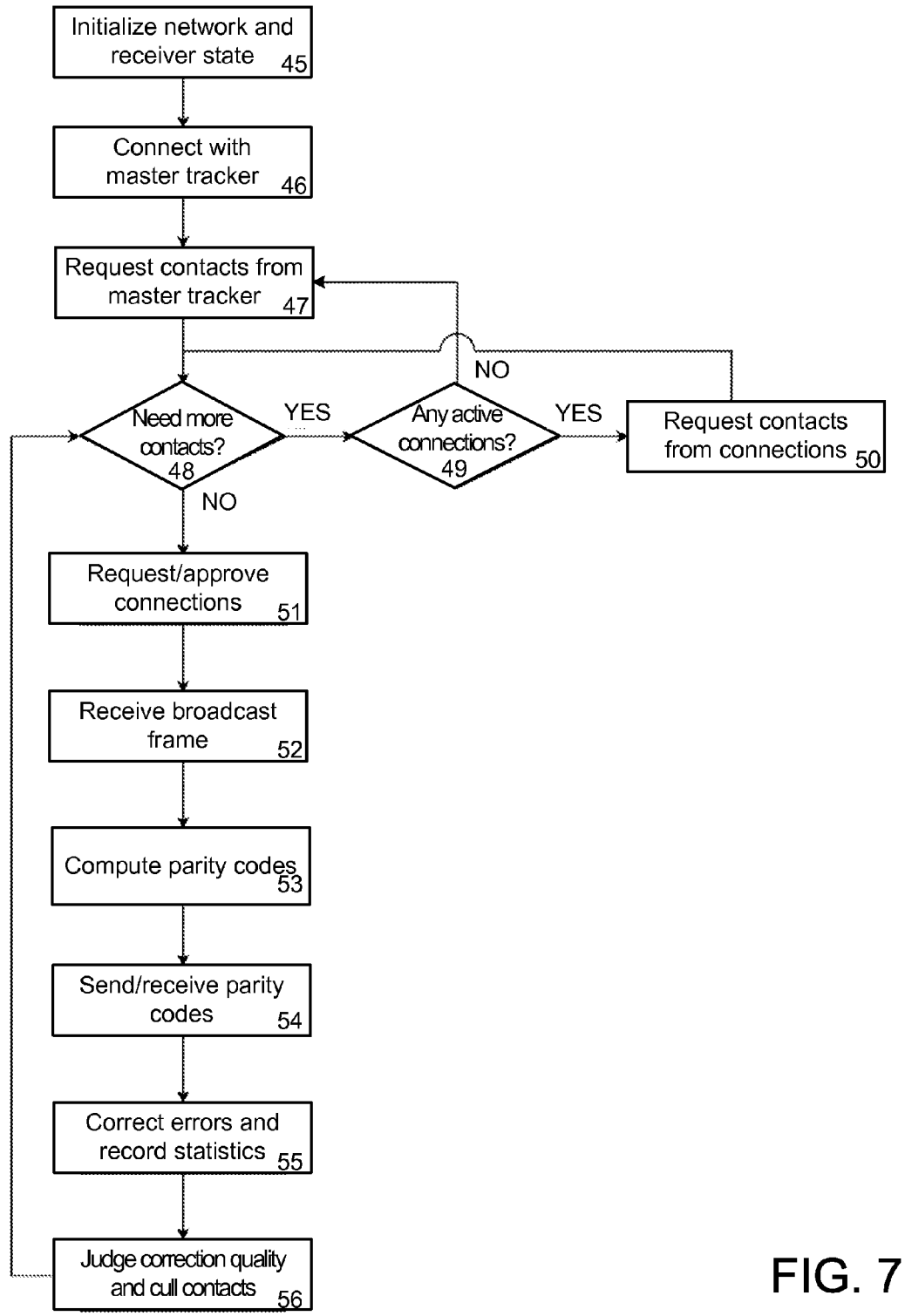
FIG. 7 is a flow chart of the processing and communication logic of the digital broadcast receiver according to an embodiment of the present invention.

FIG. 7 is a flowchart showing the processing decision logic of the digital broadcast receiver. The digital broadcast receiver is first initialized 45 by powering the circuits and component parts and then registering on the switched network. Next, the digital broadcast receiver will connect with the master tracker 46 and obtain a list of contacts of active digital broadcast receivers in the network 47 while the master tracker registers the digital broadcast receiver in the list. Each digital broadcast receiver will judge from its own reception quality how many contacts it needs to successfully correct errors. If more contacts are needed 48, the digital broadcast receiver will communicate with active connections 49 to request more contacts 50. If there are no active connections, then the digital broadcast receiver requests contacts from the master tracker. The digital broadcast receiver attempts connections with the contacts from the master tracker and responds to requests for connections by other digital broadcast receivers 51. Connection requests are transmitted along with network and error statistics to judge the quality of potential connections. Although the digital broadcast receiver may only maintain connections with a small subset of its contacts, the larger contact list provides contacts to other requesting digital broadcast receivers. After establishing a set of connections, the digital broadcast receiver receives and process digital broadcast signals frame by frame 52. Parity codes are computed from each frame 53 and exchanged with other digital broadcast receivers 54. Errors in the digital signal are corrected using the received parity codes 55 and error statistics are collected. The error statistics help judge the quality of existing connections, and ineffective connections are dropped 56. Finally, the processing loops back to determine if there are enough contacts before the digital broadcast receiver processes the next broadcast frame.

Figure 8:
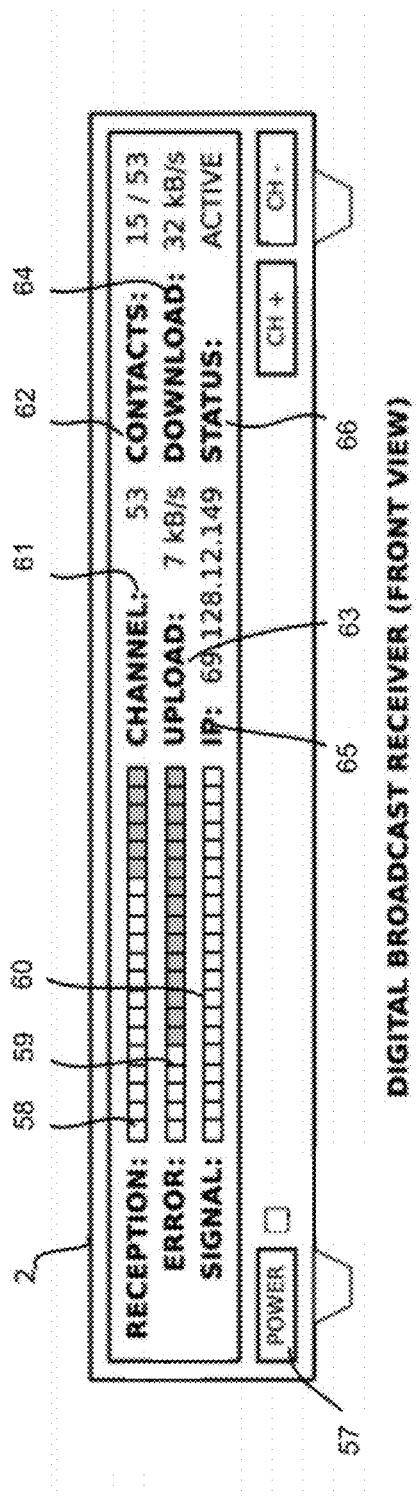
FIG. 8 is a front and back view of the digital broadcast receiver.
Figure 8:
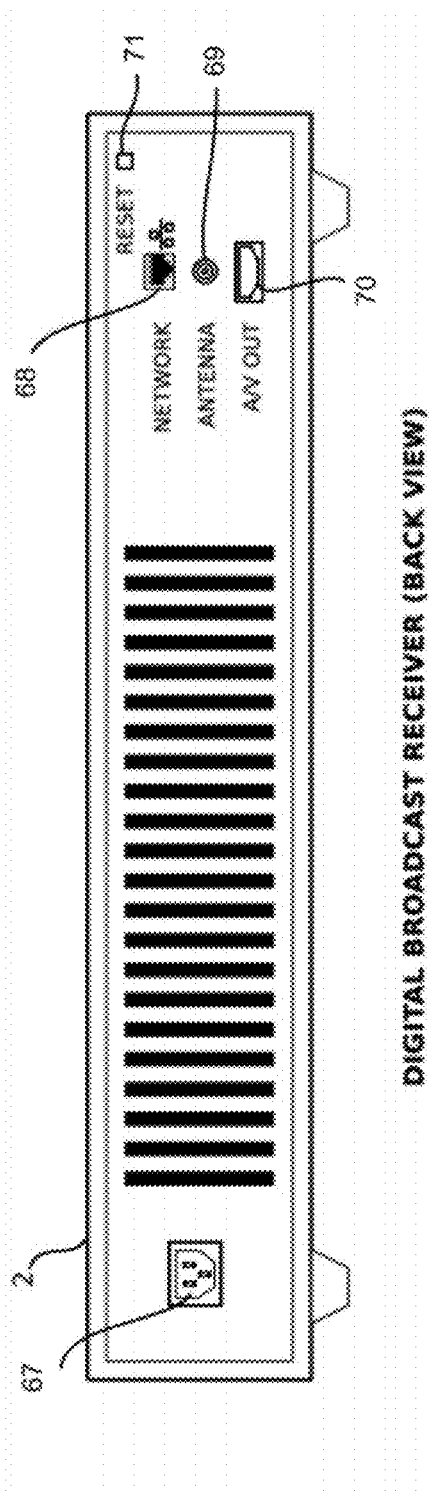

FIG. 8 shows the front and back view of the digital broadcast receiver. The front of the digital broadcast receiver contains a power button 57 to power on the device. The front display shows the signal reception quality 58, the error rate 59, and the signal correction rate 60. Other information relating to the processing state such as the channel number 61, number of contacts 62, upload rate 63, download rate 64, network address 65, and processing status 66 may also be shown. The back of the digital broadcast receiver contains an AC power socket 67, a network port 68, coaxial antenna/cable input 69, a HDMI digital audio/video out port 70, and a reset button 71 to restore the default parameters of the digital broadcast receiver.

Figure 9:
FIG. 9 is a view of the webpage for the digital broadcast receiver display and configuration.

FIG. 9 shows the webpage layout for configuring the digital broadcast receiver and viewing its processing state over a web interface. The three basic webpages are the network configuration page 72, the receiver configuration page, 73, and the receiver status page 74. The network configuration page allows definition of basic network attributes for registering the digital broadcast receiver on the network. The receiver configuration allows limits of the maximum number of contacts, simultaneous channels, upload rate, and download to be specified. The default master tracker may also be specified. Finally, the receiver status page displays statistics relating to the processing of the digital broadcast receiver.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents. Furthermore, no element, component or method step is intended to be dedicated to the public regardless of whether the element, component or method step is explicitly recited in the claims.

In the claims, reference to an element in the singular is not intended to mean "one and only one" unless explicitly stated, but rather is meant to mean "one or more." In addition, it is not necessary for a device or method to address every problem that is solvable by different embodiments of the invention in order to be encompassed by the claims.

In alternate embodiments, the invention is implemented in computer hardware, firmware, software, and/or combinations thereof. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits) and other forms of hardware.

What is claimed is:

1. A digital broadcast receiver comprising:
a demodulating circuit converting a received analog signal into a digital signal;
a network interface controller communicating with one or more additional digital broadcast receivers;
an error correction circuit coupled to the demodulating circuit, the error correction circuit generating a modified digital signal by identifying and correcting errors in the digital signal using parity data included in the digital signal;
a buffer coupled to the error correction circuit for storing the modified digital signal; and
a parity coding and decoding circuit coupled to the buffer and to the network interface controller, the parity coding and decoding circuit generating revised parity code blocks from the modified digital signal and generating a corrected digital signal by correcting errors in the modified digital signal using additional parity code blocks received from an additional digital broadcast receiver via the network interface controller.

2. The digital broadcast receiver of claim 1, wherein the demodulating circuit converts the analog signal into a plurality of digital channels.

3. The digital broadcast receiver of claim 1, further comprising an error detection circuit coupled to the error correction circuit, the error detection circuit calculating a set of error statistics.

4. The digital broadcast receiver of claim 3, wherein the set of error statistics comprises an error rate and an error distribution.

5. The digital broadcast receiver of claim 1, further comprising a controlling part coupled to the buffer, the network controller and the error detection circuit, the controlling part managing communication with the additional digital broadcast receiver and determining a quality associated with the additional digital broadcast receiver.

6. The digital broadcast receiver of claim 5, wherein the controlling part determines whether to accept a connection request from a remote digital broadcast receiver by determining an error correction potential of the remote digital broadcast receiver.

7. The digital broadcast receiver of claim 6, wherein the controlling part further determines whether to accept the connection request from the remote digital broadcast receiver based on a network bandwidth, a network latency, an error rate associated with the remote digital broadcast receiver and an error distribution associated with the remote digital broadcast receiver.

8. The digital broadcast receiver of claim 5, wherein the controlling part includes a contact list describing one or more remote digital broadcast receivers from which to request additional parity data.

9. The digital broadcast receiver of claim 5, wherein the controlling part further hosts a secure web page to display the signal quality and network status, and also to allow configuration of the control parameters from a web terminal communicatively coupled to the digital broadcast receiver.

10. The digital broadcast receiver of claim 9, wherein the control parameters are transmitted to the network interface controller via the web page.

11. The digital broadcast receiver of claim 1, wherein the network interface controller transmits a connection request packet to the additional digital broadcast receiver requesting the additional parity code blocks.

12. The digital broadcast receiver of claim 1, wherein the analog signal comprises a television signal, a radio signal or a signal from a satellite.

13. The digital broadcast receiver of claim 1, herein the additional parity code are generated using Reed-Solomon coding.

14. A system for compensating independent bit errors encountered during a digital broadcast transmission, the system comprising:
a local digital broadcast receiver generating a digital signal by demodulating an analog signal, the digital signal including errors, generating a modified digital signal including uncorrected errors using parity data included in the digital signal to correct a subset of the errors and transmitting a request for data correcting the uncorrected errors;
a remote digital broadcast receiver communicatively coupled to the local digital broadcast receiver, the remote broadcast receiver demodulating the analog signal to generate a remote digital signal, generating remote parity data from the remote digital signal and communicating the remote parity data to the local digital broadcast receiver,
wherein the local digital broadcast receiver corrects the uncorrected errors in the modified digital signal using the remote parity data.

15. The system of claim 14, further comprising:
a tracker communicatively coupled to the local digital broadcast receiver and the remote digital broadcast receiver, the tracker receiving the request for data correcting the uncorrected errors, identifying the remote digital broadcast receiver from a contact list and transmitting data identifying the remote digital broadcast receiver to the local digital broadcast receiver.

16. The system of claim 14, wherein the local digital broadcast receiver further comprises a contact list identifying additional digital broadcast receivers communicatively coupled to the local digital broadcast receiver.

17. The system of claim 16, wherein the contact list is modified depending on a set of error statistics associated with each additional digital broadcast receiver and a set of error statistics associated with the local digital broadcast receiver.

18. The system of claim 17, wherein the set of error statistics associated with each additional digital broadcast receiver comprises an error rate and an error distribution.

19. The system of claim 18, wherein the set of error statistics associated with the local digital broadcast receiver comprises a local error rate and a local error distribution.

20. The system of claim 13, the analog signal comprises a television signal, a radio signal or a signal from a satellite.

21. The system of claim 13, wherein the local digital broadcast receiver further receives control parameters from a web-based interface.

22. The system of claim 13, wherein communicating the remote parity data to the local digital broadcast receiver comprises:
streaming the remote parity data to the local digital broadcast receiver.

23. A method for compensating independent bit errors encountered during a digital broadcast transmission, the method comprising the steps of:

generating a digital signal from an analog signal, the digital signal including errors;

generating a modified digital signal including uncorrected errors by correcting a subset of errors in the digital signal using parity data included in the digital signal;

transmitting a request for additional error correction data to a remote digital broadcast receiver which also receives the analog signal;

receiving remote parity data generated by the remote digital broadcast receiver from the analog signal; and generating a corrected digital signal by correcting the uncorrected errors in the modified digital signal using the remote parity data.

24. The method of claim 23, further comprising:
identifying an additional digital broadcast receiver; and
transmitting the remote parity data to an additional digital broadcast receiver.

25. The method of claim 23, further comprising:
generating error statistics associated with the remote digital broadcast receiver; and
determining whether to transmit a second request for additional error correction data to the remote digital broadcast receiver using the error statistics associated with the remote digital broadcast receiver.

26. A system for intercepting a communication comprising:

a local digital broadcast receiver receiving a broadcast communication, generating a digital signal by demodulating the broadcast communication, the digital signal including errors, generating a modified digital signal including uncorrected errors using parity data included in the broadcast communication to correct a subset of the errors and transmitting a request for data correcting the uncorrected errors;

a remote digital broadcast receiver communicatively coupled to the local digital broadcast receiver and receiving the broadcast communication, the remote broadcast receiver demodulating the broadcast communication to generate a remote digital signal, generating remote parity data from the remote digital signal and communicating the remote parity data to the local digital broadcast receiver responsive to receiving the request for data correcting the uncorrected errors, wherein the local digital broadcast receiver corrects the uncorrected errors in the modified digital signal using the remote parity data.

* * * * *